United States Patent [19]

Deacon et al.

[11] Patent Number: 5,792,269
[45] Date of Patent: Aug. 11, 1998

[54] GAS DISTRIBUTION FOR CVD SYSTEMS

[75] Inventors: Thomas E. Deacon, Sunnyvale; David Cheung, Foster City; Peter Wai-Man Lee, Fremont; Judy H. Huang, Los Gatos, all of Calif.

[73] Assignee: Applied Materials, Inc., Santa Clara, Calif.

[21] Appl. No.: 550,668

[22] Filed: Oct. 31, 1995

[51] Int. Cl.$^6$ .................................................. C23C 16/00
[52] U.S. Cl. ...................... 118/715; 118/723 E; 156/345; 204/298.07; 204/298.33
[58] Field of Search ................................ 118/723 E, 715; 156/345; 204/298.07, 298.33

[56] References Cited

U.S. PATENT DOCUMENTS 5,158,644  10/1992  Cheung ........................ 156/643
5,589,002  12/1996  Su ........................... 118/723 E

FOREIGN PATENT DOCUMENTS 37 15 644 A1  12/1988  Germany.

Primary Examiner—R. Bruce Breneman
Assistant Examiner—Jeffrie R. Lund
Attorney, Agent, or Firm—Fish & Richardson P.C.

[57] ABSTRACT

A substrate processing system including a vacuum chamber; a pedestal which holds a substrate during processing; and a gas distribution structure which during processing is located adjacent to and distributes a process gas onto a surface of the substrate that is held on the pedestal for processing. The gas distribution structure includes a gas distribution faceplate including a plurality of gas distribution holes formed therethrough, wherein the holes of at least a first set of the plurality of holes pass through the faceplate at angles other than perpendicular to the surface of substrate.

14 Claims, 18 Drawing Sheets

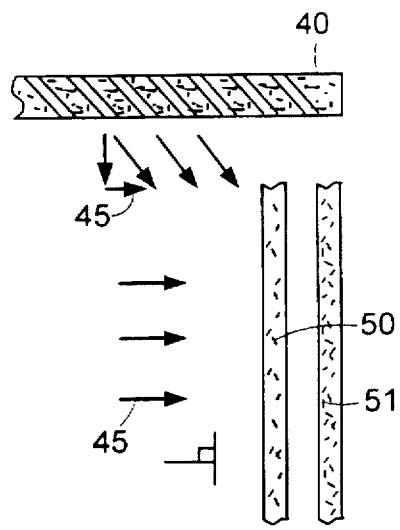
FIG. 7a
FIG. 7b
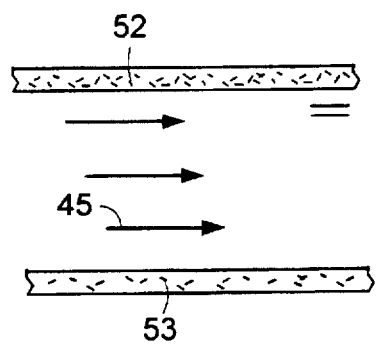
FIG. 7c

5,792,269

GAS DISTRIBUTION FOR CVD SYSTEMS

FIELD OF THE INVENTION

This invention relates in general to the field of chemical vapor deposition and, in particular, to gas distribution faceplates used in a plasma enhanced chemical vapor deposition (PECVD) system.

BACKGROUND OF THE INVENTION

Layers of conducting, semiconducting, and insulating materials are applied to silicon wafers during integrated circuit fabrication to form multilayered electrical components (e.g. transistors) and single layer conductive (e.g. metal) lines, collectively referred to as "features". A cross section view of metal lines in FIG. 1 shows an example of such features. To increase the packing density of integrated circuits, the distance between features on the integrated circuit has been dramatically reduced. Typically, metal lines carrying electrical signals are arranged to run closely adjacent to one another and silicon oxide, which serves as an insulator, is deposited over and around the metal lines to insulate them from each other and prevent electrical shorts. When an insulator is deposited over and around the metal lines, the minimum insulation thickness typically occurs along the sidewall of the metal lines.

Referring to FIG. 2, a typical vacuum deposition system which can be used to deposit such insulating films includes a deposition chamber 25 in which a susceptor 28 supports a wafer in a processing position 29 opposite a gas distribution faceplate 30 through which reactant gas is supplied to the chamber 25. After the chamber has been evacuated to an appropriate pressure that is below atmospheric pressure (e.g. less than 10 torr), a heat source, such as a high intensity light source, heats the wafer to a processing temperature. Reactant flows into the chamber through the faceplate and toward the susceptor. An RF signal is applied to the gas distribution faceplate 30 which causes the incoming gas to form a plasma between the faceplate and the grounded susceptor plate 28. Some of the byproducts of the plasma excited reactant gas deposit onto the surface of the wafer and the rest of the reactant gas is collected through the vacuum system.

The faceplate includes an array of holes through which the reactant gas passes into the chamber. The faceplate is generally designed to produce a uniform flow of deposition process byproducts onto the surface of the wafer and thereby produce a uniform deposition. The hole pattern in the distribution faceplate is typically carefully chosen only after extensive testing to assure that a uniform deposition of process byproducts on the surface of the wafer results.

A reactant gas that is commonly used to deposit $SiO_2$ films on the wafer is silane ($SiH_4$ and $N_2O$). The $SiH_4$ and $N_2O$ reactant gas enters the vapor deposition chamber, passes through holes in the gas distribution faceplate 30, and over the surface the wafer, where some of it deposits onto the wafer. The gas species that does not deposit onto the wafer is collected and removed from the chamber through one or more vacuum system collection locations, as indicated by arrows 32.

Each molecule of gas species that is injected into the chamber through the faceplate does not, however, move in a straight line from the faceplate to the surface of the wafer. On the contrary, the molecules move in a random manner as a result of collisions with other molecules. The natural random movement of the gas species that enters the chamber is characterized by a mean free path. This is the average distance that a gas species molecule travels before colliding with another gas species molecule and changes direction. The mean free path is a function of the pressure of the gas. At the pressures generally used for CVD, the mean free path of the gas species is approximately one micron (1 µm). Since the distance between the gas distribution faceplate and the surface of the wafer is much greater than the mean free path, the gas species molecules will experience many collisions as they move from the gas distribution faceplate to the surface of the wafer.

The movement of gas over the wafer's surface provides a constantly renewed supply of reactants for deposition on the wafer's surface. The 1 µm mean free path together with the transverse flow of gas across the wafer surface tends to produce uniform coverage over the entire surface of the wafer. Even though the gas distribution and its flow pattern might be properly selected to produce a uniform thickness of film on top of the wafer, sidewall coverage may still not be acceptable.

In such systems, the thickness of the film that is deposited on the sidewalls of the metal lines is influenced by the spacing between lines and the thickness of the metal lines. A useful measure which is a function of these two parameters is the "aspect ratio" The aspect ratio of a metalization structure is defined as the height (h) of the metal lines divided by the spacing (s) between metal lines (i.e., aspect ratio=h/s). As the spacing between the lines decreases or as the height of the lines increases, the aspect ratio increases.

During a typical CVD process, silicon oxide might be deposited around the metal lines. When the spacing between metal lines is as large as 2 to 3 µm, good sidewall coverage on the metal lines is generally assured. This relatively wide spacing between the metal lines allows the plasma generated reactants to readily penetrate into the spaces between the metal lines to deposit onto the sidewalls. However, as the spacing between metal lines decreases (i.e., as the aspect ratio increases) difficulties arise. The reactants do not penetrate as effectively into the spaces between the metal lines and sidewall coverage is not as good.

Referring again to FIG. 1, when insulation 20 is deposited, it is important that the insulation has a minimum continuous thickness on the exposed surfaces 22a, 22b, and 22c of the metal lines. In traditional CVD processing of high aspect ratio structures, film thickness on the sidewall of the metal line and the bottom of the space between metal lines is typically only a fraction of the top film thickness. By convention, sidewall film thickness is measured at a point that is halfway down the sidewall. Though film thickness along the sidewall and the bottom of the space between the lines is not linearly proportional to the top thickness, nevertheless evaluating film thickness at the mid-point of the sidewall provides an excellent indicator of the effectiveness of changes in process conditions, including system geometry. Sidewall film thickness is typically evaluated as a percentage (%) of the total thickness of metal that is deposited on top of the metal line.

In instances where the film is for nitride passivation or for providing an hermetic seal, the integrity of the deposited film can be compromised by voids or porosity in the film. A common phenomenon which produces voids is known as cusping or bread loafing. This phenomenon is characterized by an enhanced buildup of deposited material near the top corner of the metal lines. An example of this enhanced buildup is shown in FIG. 1. In extreme cases of cusping or bread loafing, insulation completely spans the gap between the metal lines without entirely filling the space, thereby forming an enclosed void between adjacent metal lines.

Since poor sidewall coverage and voids produce device reliability problems, system designers have expended considerable effort to solve the problem of poor sidewall coverage. Their efforts have included using mixed RF frequency plasma energy sources and conducting many experiments with different flow rates and pressures in search of an optimum set of process parameters. In spite of these efforts, however, the problem has persisted, particularly as aspect ratios have been increased even more.

SUMMARY OF THE INVENTION

The invention greatly improves sidewall step coverage. The invention involves directing reactant gas toward the surface of the wafer at angles other than 90°. This is accomplished by using a gas distribution faceplate that includes gas distribution holes which are angled in a direction which produces the desired flow direction. In other words, the holes are formed through the thickness of the faceplate in directions that are other than 90° (e.g. 36°). Several configurations of gas distribution faceplates are described below.

Tests have shown that the invention produces as much as a 35% improvement in sidewall step coverage as compared to prior art processes where gas flow is directed perpendicular to the surface of the wafer. This improvement in step sidewall coverage will result in a substantial improvement in integrated circuit reliability and will enable circuit designers to further reduce device size. The improved sidewall step coverage also permits greater flexibility in selecting process conditions for fabricating device structures characterized by higher aspect ratios.

A method of improving sidewall coverage in CVD and PECVD processes according to the invention includes the steps of: establishing conditions in an evacuated chamber for processing a wafer; and directing inlet reactant gas flow toward the surface of the wafer at an angle other than ninety degrees to the plane of the surface of the wafer. The angle at which the inlet reactant gas flow is directed is between approximately 82 and 62 degrees from the surface plane of the wafer. Also, the inlet reactant gas flow is directed toward said wafer by a gas distribution faceplate having holes that are formed at an angle through the thickness of the faceplate and through which the inlet gas flow passes on its way toward the wafer surface.

BRIEF DESCRIPTION OF THE DRAWINGS

FIGS. 7A, 7B, and 7C show the relationship between the horizontal component of gas flow (i.e., parallel to the surface of the wafer) and the orientation of metal lines running on the surface of a wafer across which an insulating layer needs to be deposited;

DETAILED DESCRIPTION

Figure 4:
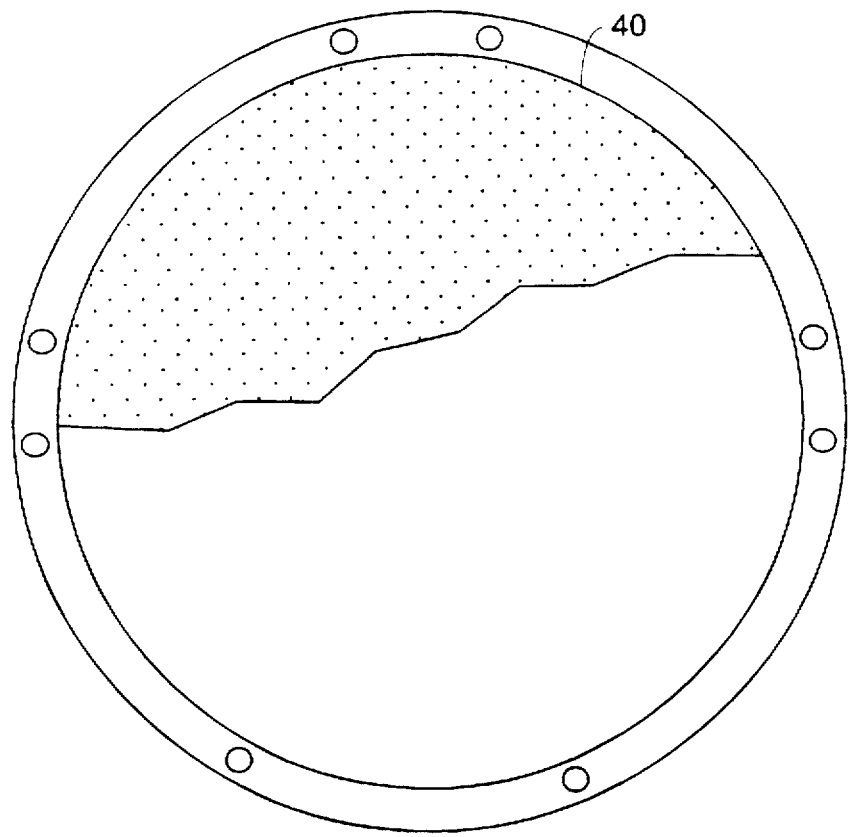
FIGS. 4 and 4A show top and cross sectional views of a configuration of a gas distribution faceplate.
Figure 4A:
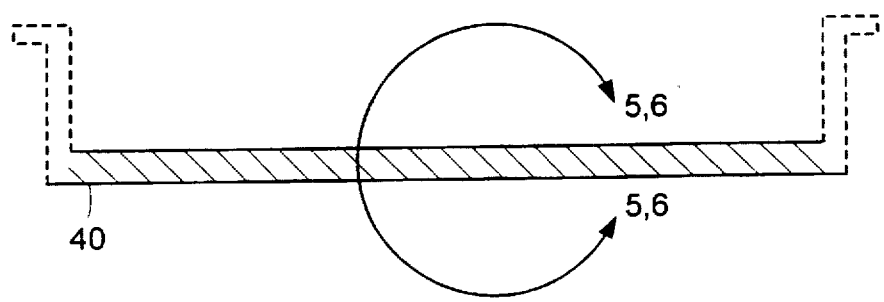
Figure 5:
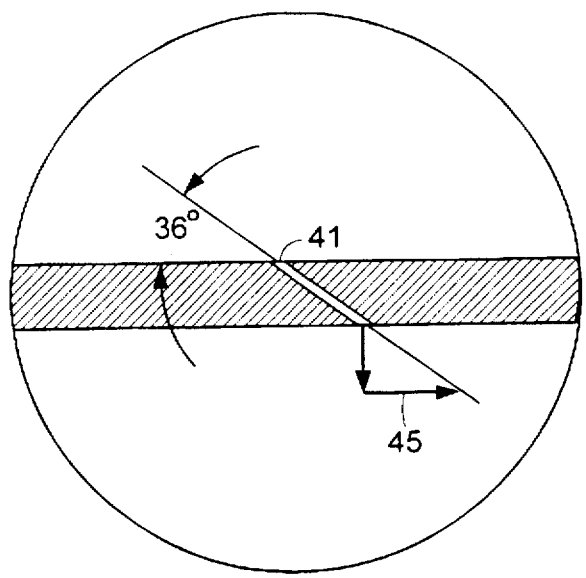
FIGS. 5 and 6 show close-up views of the cross section of the gas distribution faceplate of FIGS. 4 and 4A.
Figure 6:
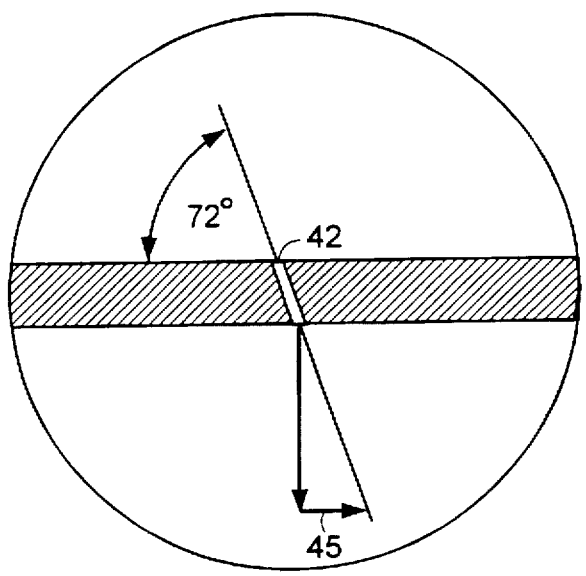

By using a gas distribution faceplate (see FIGS. 4, 5, and 6) having holes that direct the gas flow toward the substrate (e.g. wafer) at angles other than 90 degrees, we have achieved improved sidewall and step coverage. FIGS. 5 and 6 show two representative angles at which gas passages through the faceplate were formed and also show the horizontal vector component 45 of the gas flow through such passages.

We believe that the improvement in sidewall and step coverage can be explained by the gas phase transport phenomenon. In an ideal gas, the instantaneous direction of an individual molecule or atom results from the overall macroscopic flow direction subject to the modification of that direction imparted from the last few intermolecular or interatomic collisions. In the case of the present invention, we have modified the macroscopic initial flow direction. Though one might expect the effects of the initial conditions to diminish rapidly due of the many intermolecular or interatomic collisions which occur as the gas travels from the faceplate to the wafer, apparently, the effects of the initial conditions actually persist to a significant degree all of the way to the wafer. A further observation is that the effects of the initial conditions also persist in spite of the electric field in the plasma sheath.

Figure 1:
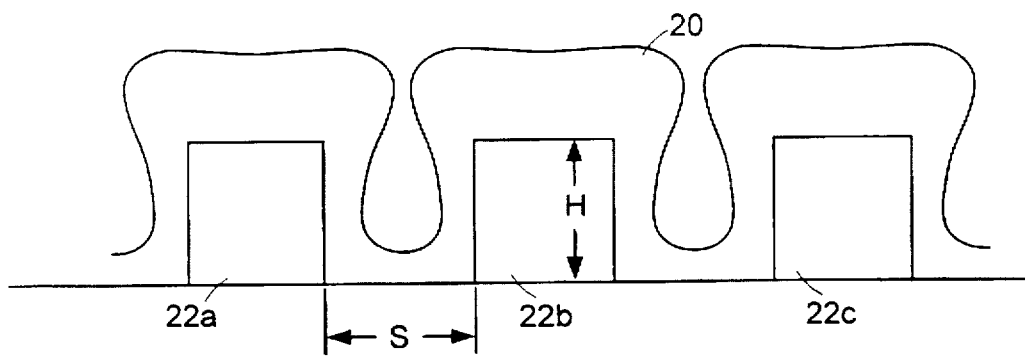
FIG. 1 shows several adjacent metal lines and step film coverage over those lines as seen in the prior art.
Figure 2:
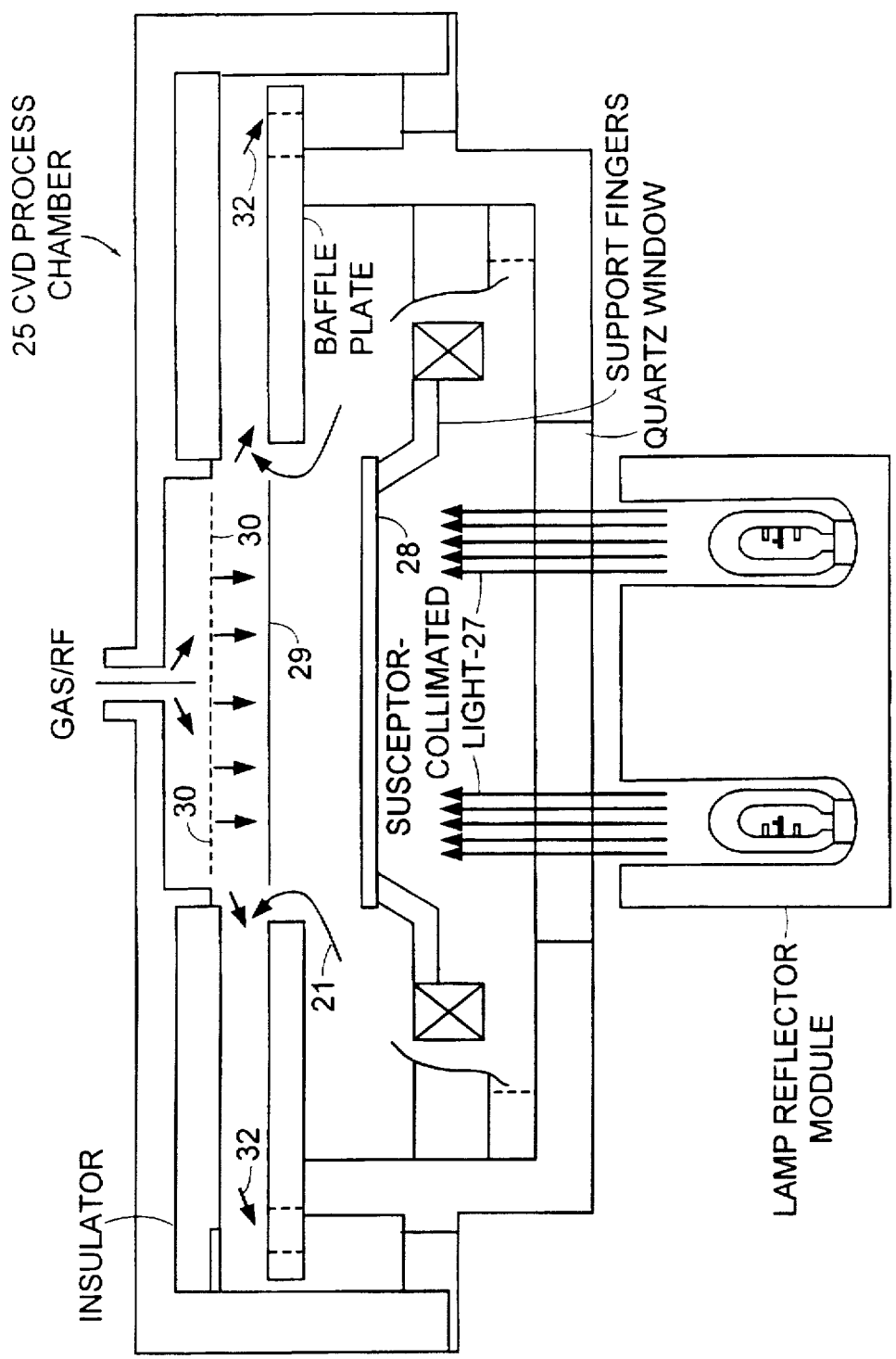
FIG. 2 shows a schematic cross section of a PECVD processing chamber.
Figure 3:
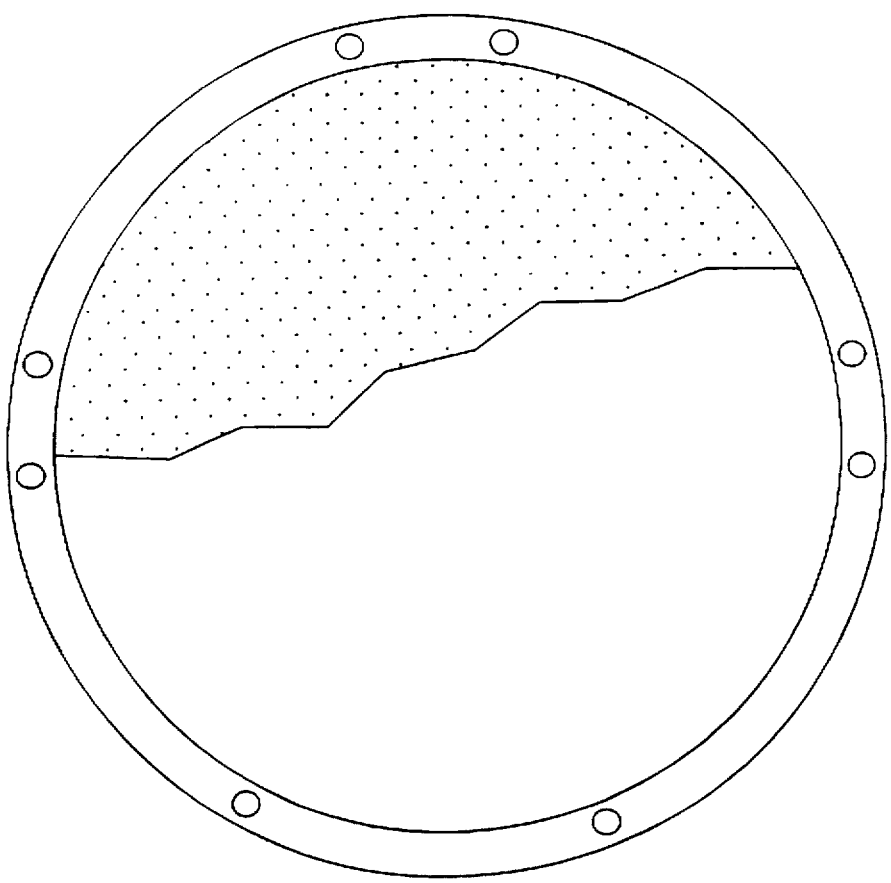
FIGS. 3 and 3A show plan and cross sectional views of a prior art gas distribution faceplate.
Figure 3A:
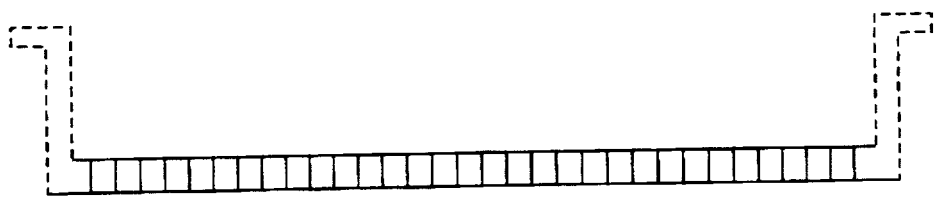

To evaluate the improvement produced by the modified gas flow, we used a PECVD processing chamber such as that shown in FIG. 2 but fitted with different gas distribution faceplates, examples of which are illustrated in FIGS. 4, 4A, 5, and 6. All faceplates 40 were approximately 0.37 in. (9.4 mm) thick and had approximately 1400 uniformly distributed holes 41 or 42, each having a 0.029 in. (0.74 mm) dia. With this system, we processed test wafers and measured the resulting sidewall coverage.

FIG. 7A shows a cross section of faceplate 40 with gas distribution holes oriented at a predetermined angle (e.g. 36 degrees) relative to the surface of the faceplate and the surface of the wafer. The horizontal vector component of the gas flow is represented by the arrow 45. We processed multiple wafers, some of which had metal lines 50 and 51 (i.e., Al lines) oriented perpendicular to the horizontal vector component 45 (see FIG. 7B) and others of which had the metal lines 52 and 53 oriented parallel to the horizontal vector component 45 (see FIG. 7C). We also evaluated two different hole angles through the gas distribution faceplate, namely, 36 degrees and 72 degrees. In all cases, the angled holes were parallel to one another. Finally, we also evaluated both high frequency (HF, e.g. 13.56 MHz) and mixed frequency (MF, e.g. 450 KHz and 13.56 MHz) operation in the process chamber.

The process conditions for the process runs and the results of the process runs are presented in Tables 1 and 2, below:

TABLE 1

Using HF Power

| Process HF SiH4/N2O | units | 1 | 2a | 2b | 3a | 3b | 4a | 4b | 5a | 5b |
|---|---|---|---|---|---|---|---|---|---|---|
| press | torr | 2.93 | 2.93 | 2.93 | 2.93 | 2.93 | 2.93 | 2.93 | 2.93 | 2.93 |
| RF1 | watts | 130 | 130 | 130 | 130 | 130 | 130 | 130 | 130 | 130 |
| RF2 | watts | | | | | | | | | |
| temp | °C. | 400 | 400 | 400 | 400 | 400 | 400 | 400 | 400 | 400 |
| spacing | mils | 340 | 400 | 400 | 300 | 300 | 200 | 200 | 300 | 300 |
| spacing | mm | 8.636 | 10.16 | 10.16 | 7.62 | 7.62 | 5.08 | 5.08 | 7.62 | 7.62 |
| SiH4 | sccm | 55 | 55 | 55 | 55 | 55 | 55 | 55 | 55 | 55 |
| N2O | sccm | 400 | 400 | 400 | 400 | 400 | 400 | 400 | 400 | 400 |
| Nf | | 1.4725 | 1.461 | 1.4761 | 1.4876 | 1.5081 | 1.4953 | 1.5129 | 1.4874 | 1.5055 |
| D.R. | Å/m | 8300 | 6900 | 9349 | 8880 | 10200 | 10436 | 12394 | 8814 | 10200 |
| Stress | dynes/cm2 | −4.00E+08 | — | — | — | — | — | — | — | — |
| WERR | | 2.4 | — | — | — | — | — | — | — | — |
| film thickness | Å | 5333 | 4167 | 5500 | 4670 | 5000 | 4000 | 4333 | 4667 | 5167 |
| metal height | Å | 8333 | 7667 | 7667 | 7667 | 7667 | 7667 | 7667 | 7667 | 7667 |
| normalization factor, f* | | 1.11 | 0.80 | 1.10 | 0.90 | 0.96 | 0.77 | 0.83 | 0.89 | 1.0 |
| Side coverage** spacing: | % of top thickness | | | | | | | | | |
| 0.8 μm | % | | 34 (38) | 40 (32) | 48 (53) | 50 (45) | 50 (48) | 58 (44) | 54 (45) | 43 (38) | 54 (54) |
| 1.0 μm | % | | 39 (43) | 48 (38) | 52 (57) | 57 (51) | 60 (58) | 67 (51) | 62 (51) | 67 (59) | 62 (62) |
| 1.1 μm | % | | | | 66 (?-) | | | | | | |
| 1.2 μm | % | 52 (58) | | | 57 (51) | 67 (64) | 67 (51) | 65 (54) | 67 (60) | |
| 1.3 μm | % | | | 60 (48) | 64 (70) | | | | | 46 (?-) | 65 (65) |
| 1.4 μm | % | 48 (53) | | | 64 (57) | 73 (70) | | | | |

*normalization factor, f = ((film thickness/5000Å)*(metal height/8000Å))
**step coverage raw data are listed, in parenthesis corrected raw data are listed according to correction factor "f" ( f = ((film thickness/5000Å)*(metal height/8000Å)) )

Note:
1 uses std. faceplate,
2–#5 uses faceplate accordinq to the invention,
1 standard plate holes at 90° fr. horiz
2a holes at 36° fr. horiz ⊥ to metal line
2b holes at 72° fr. horiz ⊥ to metal line
3a holes at 36° fr. horiz ⊥ to metal line
3b holes at 72° fr. horiz ⊥ to metal line
4a holes at 36° fr. horiz ⊥ to metal line
4b holes at 72° fr. horiz ⊥ to metal line
5a holes at 36° fr. horiz ⊥ to metal line
5b holes at 72° fr. horiz ⊥ to metal line
⊥ = perpendicular;
// = parallel

TABLE 2

MIXED FREQUENCY PROCESS

| Process "MF" SiH4/N2O | units | 1* | 2a* | 2b* |
|---|---|---|---|---|
| press | torr | 2.93 | 2.93 | 2.93 |
| RF1 | watts | 60 | 60 | 60 |
| RF2 | watts | 70 | 70 | 70 |
| temp | °C. | 400 | 400 | 400 |
| spacing | mils | 450 | 300 | 300 |
| spacing | mm | 11.43 | 7.62 | 7.62 |
| SiH4 | sccm | 55 | 55 | 55 |
| N2O | sccm | 1200 | 400 | 400 |
| Nf | | 1.4722 | 1.5021 | 1.5371 |
| D.R. | Å/m | 6800 | 8100 | 8640 |
| Stress | dynes/cm² | −2.00E+08 | — | — |
| WERR | | 2.21 | — | — |
| film thickness | Å | 5333 | 4167 | 4667 |
| metal height | Å | 8333 | 7667 | 7667 |
| normalization factor, f* | | 1.11 | 0.80 | 0.89 |
| Side coverage** | % of top thickness | | | |
| 0.8 μm | % | 40 (44) | 46 (36) | 57 (51) |
| 1.0 μm | % | 44 (49) | 46 (36) | 57 (51) |
| 1.1 μm | % | | 50 (40) | |

TABLE 2-continued

MIXED FREQUENCY PROCESS

| Process | | | | |
|---|---|---|---|---|
| 1.2 μm | % | 50 (55) | | 64 (57) |
| 1.3 μm | % | | 57 (45) | 67 (60) |
| 1.4 μm | % | 50 (55) | | |

*normalization factor, f = ((film thickness/5000Å)*(metal height/8000Å))
**step coverage raw data are listed, in parenthesis normalized raw data are listed according to correction factor "f" ( f = ((film thickness/5000Å)*(metal height/8000Å)) )
Note: #1* uses std. faceplate, #2* uses faceplate according to the invention,
1* standard plate holes at 90° fr. horiz
2a* holes at 36° fr. horiz - ⊥ to metal line
2b* holes at 72° fr. horiz - ⊥ to metal line
⊥ = perpendicular In the tables, the test cycle process conditions and the results for various runs are shown in the columns. With regard to process conditions, RF1 and RF2 are the RF signal powers that are supplied by the one or two RF energy sources, depending on whether a single high frequency source is used or multiple (i.e., two) RF sources are used; temp is the process temperature; and spacing is the separation between the gas distribution faceplate and the substrate.

given both in mils and mm. The deposition rate which the specified process conditions yielded is specified in the row labeled D.R. The remainder of the process parameters shown in the tables are self explanatory to persons skilled in the art.

We note that the columns are numbered to identify the type of faceplate that was used. Most of the columns are also labeled with the suffixes "a" or "b". Suffix "a" (e.g. column "2a") identifies process runs during which a faceplate with the 36 degree holes was used and suffix "b" (e.g. column "2b") identifies process runs during which a faceplate with the 72 degree holes was used. Also, the test cycle results numbered "2" through "4" (i.e., 2a through 4b) indicate gas flows with horizontal components that were perpendicular to the metal lines (FIG. 7B) and the test cycle results labeled "5" (i.e., 5a, 5b) indicate gas flows with horizontal components that were parallel to the metal lines (FIG. 7C). The MF (multiple frequency) standard case and MF test evaluations and are identified with an asterisk, i.e., "1*", "2a*", "2b*".

For comparison purposes, we also performed process runs using a standard faceplate with holes oriented at 90° to the wafer. In all cases, the evaluations were performed using process conditions that were generally considered to be approximately optimal for wafer processing. The standard or reference cases results are labeled "1" and "1*" for HF (high frequency) and MF (multiple frequency) powered cases, respectively.

Table 1 presents information about process run using a high frequency power source. As indicated in the legend at the bottom of Table 1, Col. "1" (#1) represents the conditions and results for a standard gas distribution faceplate with 90 degree holes.

We used test wafers with different line spacings to measure how effective the new gas distribution faceplates were in improving sidewall coverage. The line spacings that we used were as follows: 0.8μ, 1.0μ, 1.1μ, 1.2μ, 1.3μ, and 1.4μ. We then measured side coverage and report those measurements in the tables as a percentage of the total thickness of the deposited film on top of the metal line (i.e., top thickness). The results are shown in the bottom half of Table 1 and Table 2. We also normalized the side coverage information by using a normalization factor f which compensates for the slight variations between runs in film thickness and metal height. The normalization factor f is defined as follows:

$$f = \frac{\text{film thickness}}{5000 \text{ Å}} \times \frac{\text{metal height}}{8000 \text{ Å}}$$

These numbers are chosen because the target metal height was 8000 Å and the target film thickness was 5000 Å (note that typical heights ranged between 4,000 and 8,333 Å). We present the normalized data in parenthesis along side the raw data.

Figure 8:
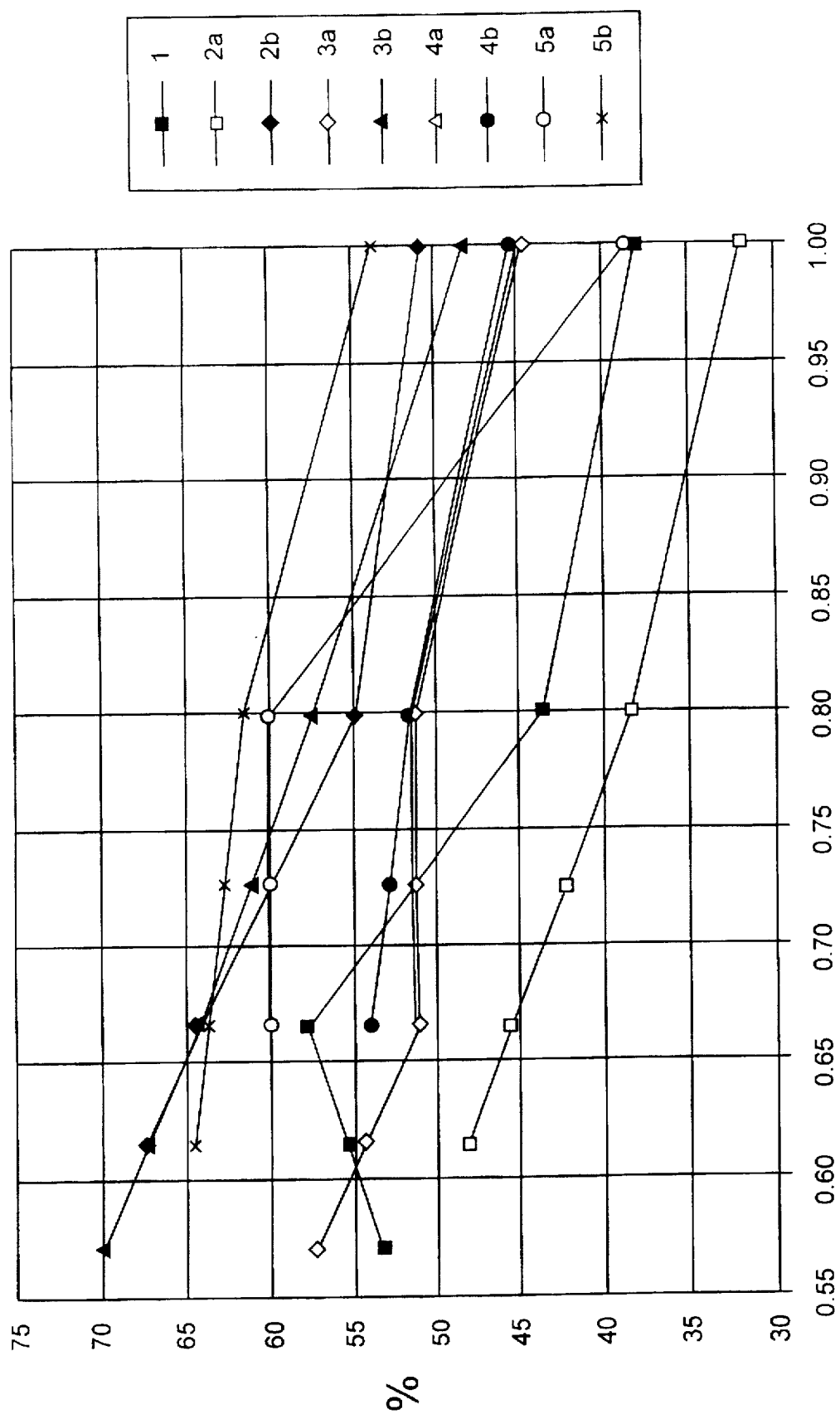
FIG. 8 is a graph showing comparison of evaluations of Table 1 (aspect ratio vs. % sidewall coverage)
Figure 9:
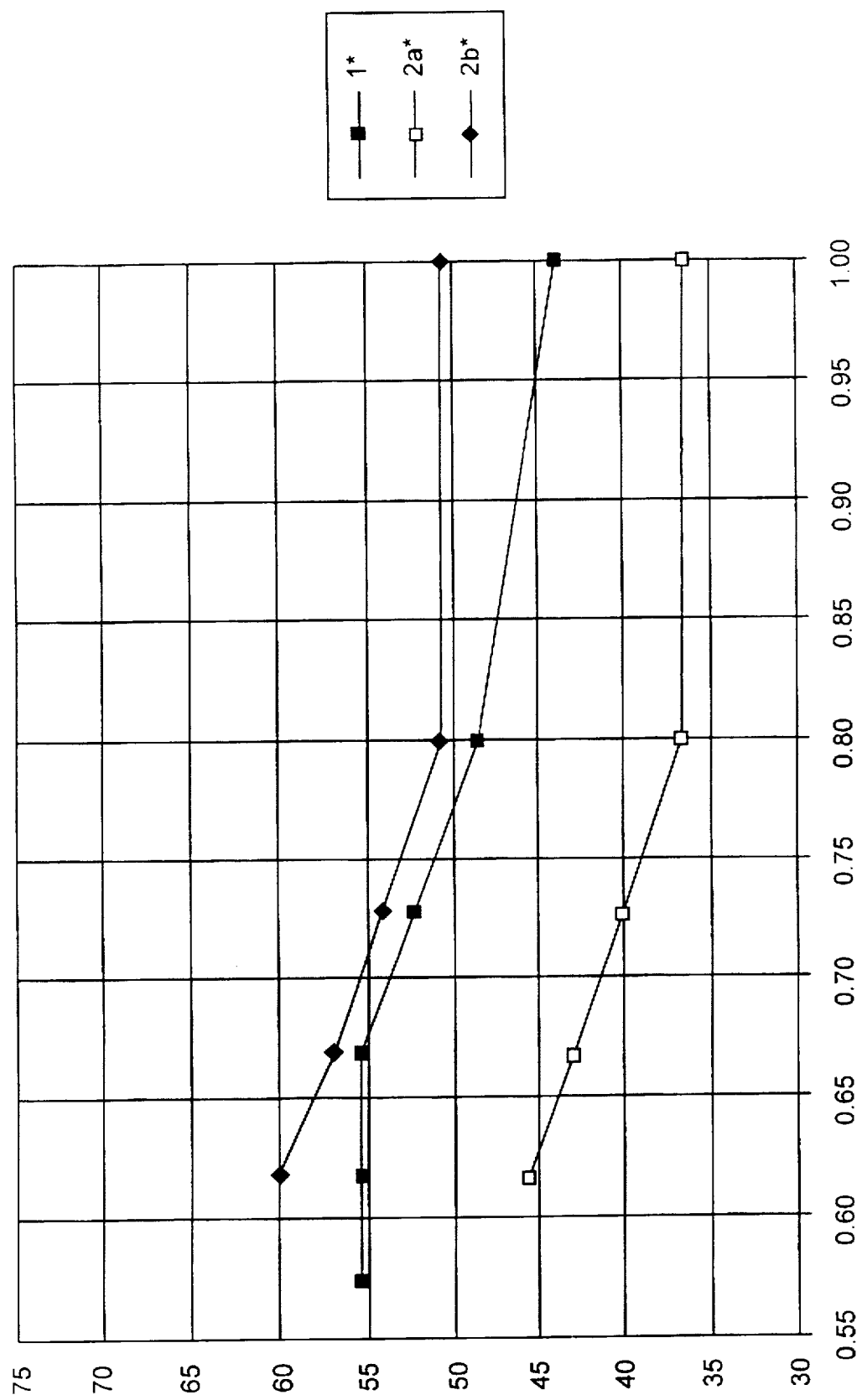
FIG. 9 is a graph showing a comparison of the number "2*" series evaluations vs. reference with MF RF power (aspect ratio vs. % sidewall coverage)

FIGS. 8 and 9 show graphs of the data presented in Tables 1 and 2. The vertical axis represents sidewall coverage and the horizontal axis represents aspect ratio. In these graphs, the step coverage of various process runs is compared to reference runs using a gas flow that was perpendicular to the wafer (and the faceplate). As is clearly indicated, step coverage improves when the gas flow is directed toward the wafer at 72 degrees (i.e., the "b" case) as compared to 90°. There is also some improvement when using a gas flow at 36 degrees (i.e., the "a" case); however, the improvement is often not as impressive as in the case of the 72 degree holes.

Since the normalization factor (f) has been applied to all evaluations including the prior art reference case, the trend for general improved sidewall coverage due to the invention is clear. As is apparent from the graphs, the improvement in sidewall coverage for an aspect ratio of one (1) can be as much as 35% when compared to the reference case.

As indicated above, for the above evaluations, the holes in any given faceplate were at the same angle and parallel to each other. We also used faceplates in which the holes were at different angles. For example, we used a circular pattern of holes in which one half of the circle included 36 degree holes and the other half included 72 degree holes, with the gas flow being directed away from a centerline where the two semi-circles of holes met. For that configuration, the tests also revealed a noticeable improvement in sidewall coverage in comparison to an initial gas flow which was perpendicular to the surface of the wafer.

While the above evaluations were performed using hole angles of 36 degrees and 72 degrees, other angles which are not equal to 90 degrees are also expected to result in improved sidewall coverage (e.g. any angles between 85° and 5° relative to the surface of the substrate).

In addition, besides the simple hole patterns described above, other more complex hole patterns can also be used. FIGS. 10–24 show just a few schematic examples of the many possibilities that exist. In those figures, the direction of the arrows represents the horizontal component of gas flow from holes distributed as shown. The layout of the holes should be selected so as to assure that the gas drawn from the supply side is drawn evenly from the faceplate surface and is distributed evenly on the chamber side. It should also be understood that it may be desirable to use a hole density that is significantly greater than that shown in the figures. For simplicity of representation, however, we have illustrated only a low density of holes. The hole configurations shown of FIGS. 10–24 will now be briefly described.

Figure 10:
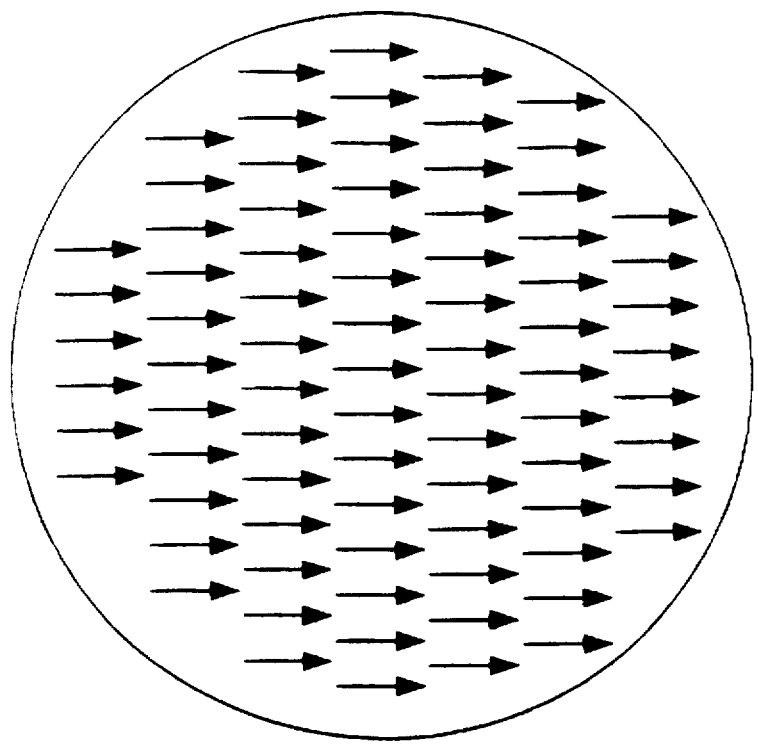
FIGS. 10 through 24 show various hole patterns through the gas distribution faceplate.

FIG. 10 shows a gas distribution faceplate with all the holes oriented in one direction, such as is typical for the samples showing improvement in sidewall coverage.

Figure 11:
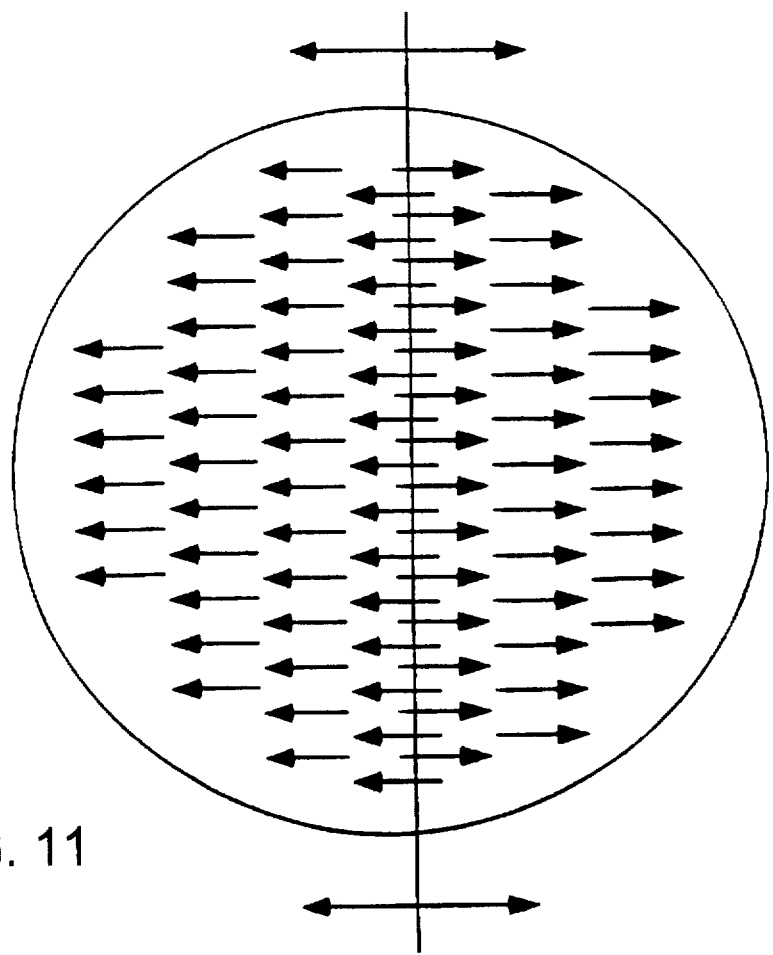

FIG. 11 shows two halves of a gas distribution faceplate, each side having holes that are in an opposite direction from the holes on the other side. Recall that some of the test data discussed above was obtained for a faceplate that was of this type.

Figure 12:
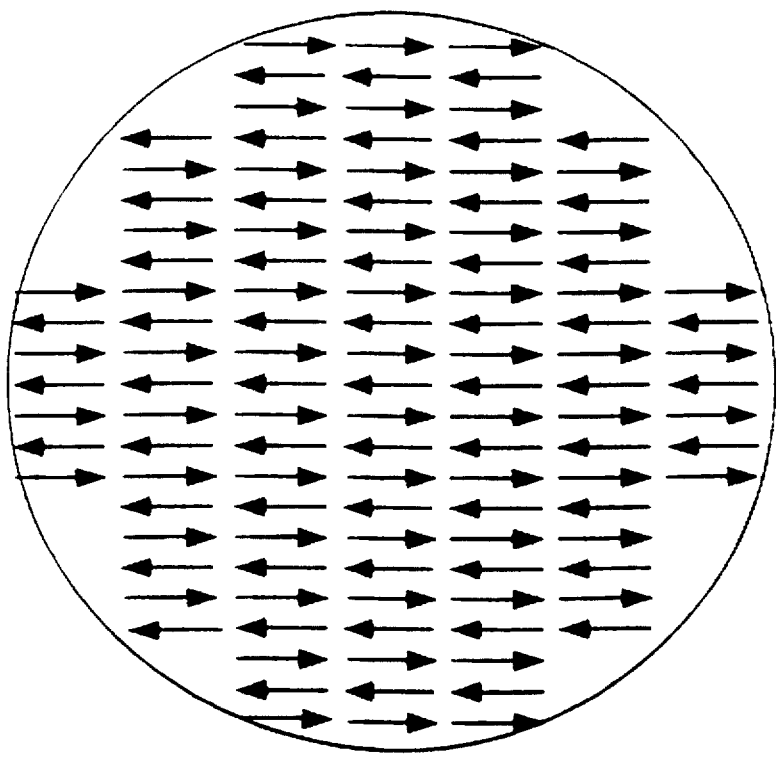

FIG. 12 shows a hole pattern with alternating directions of holes adjacent one another.

Figure 13:
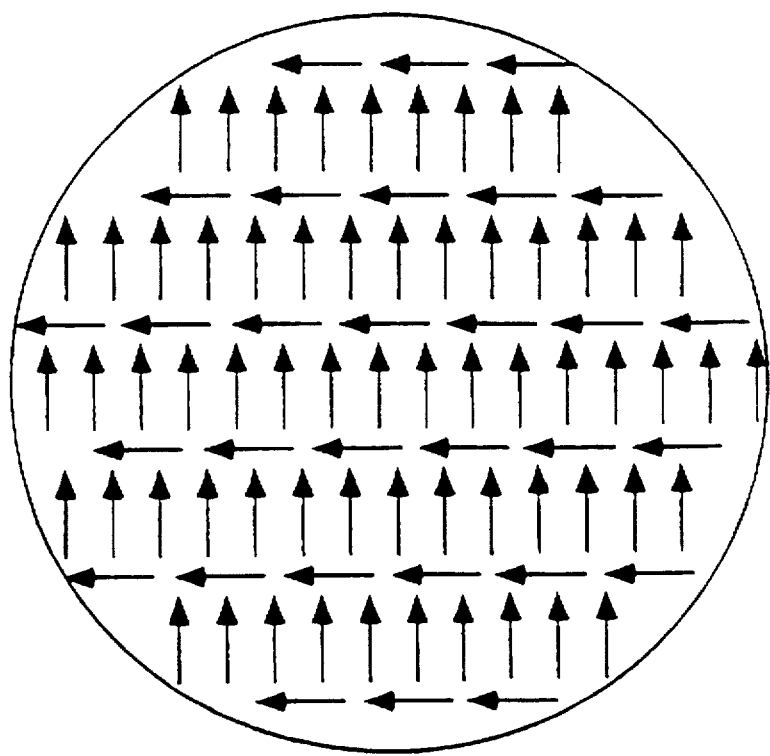

FIG. 13 shows holes (nozzles) in two directions.

Figure 14:
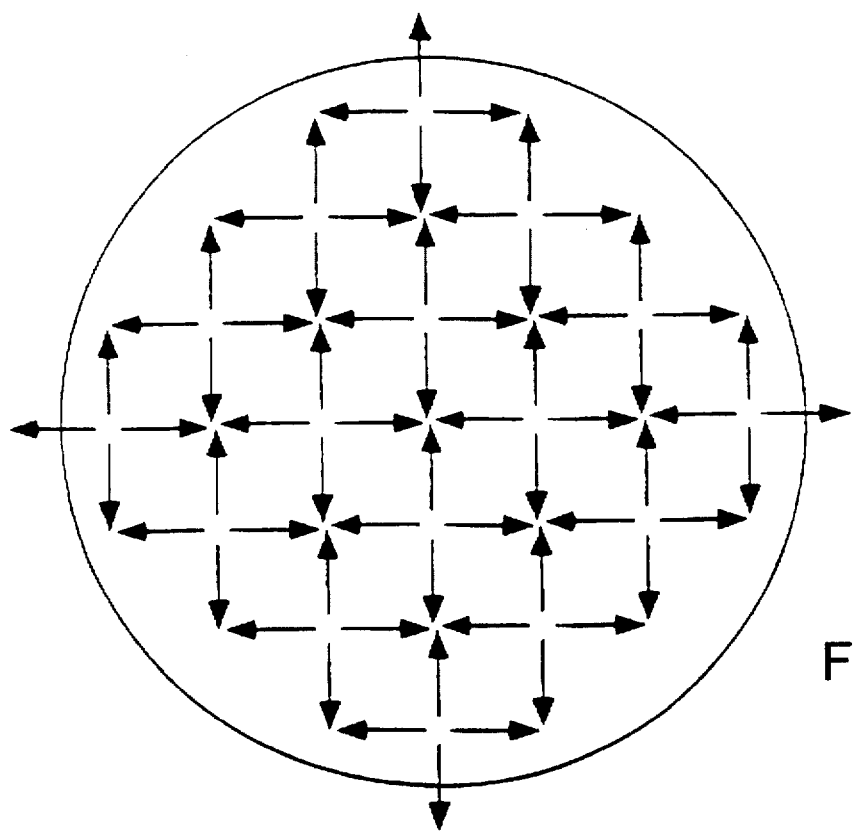

FIG. 14 shows holes in four directions with the nozzles generally opposing one another directly.

Figure 15:
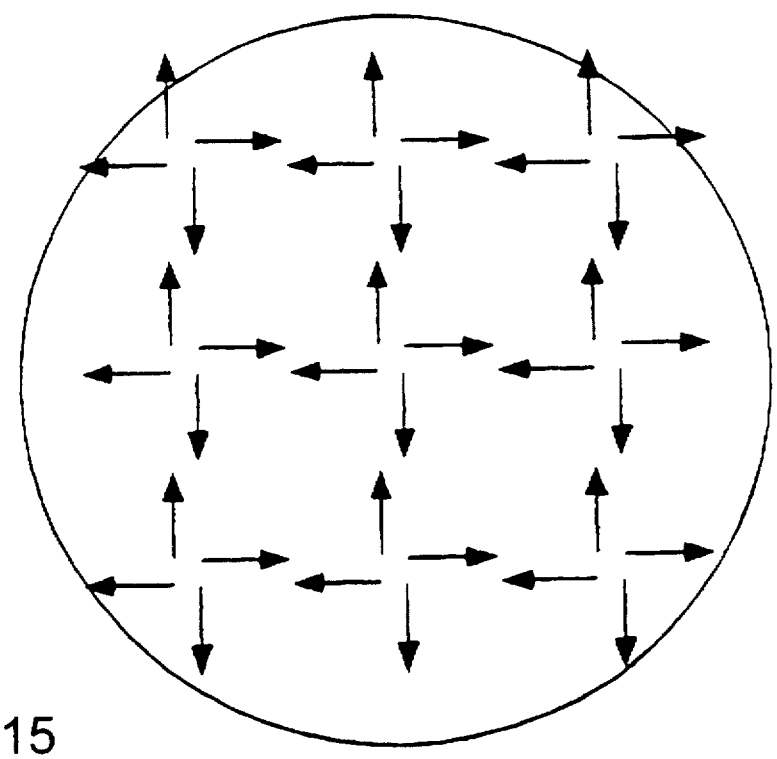

FIG. 15 shows holes in four directions with the nozzles generally offset to avoid opposing one another directly.

Figure 16:
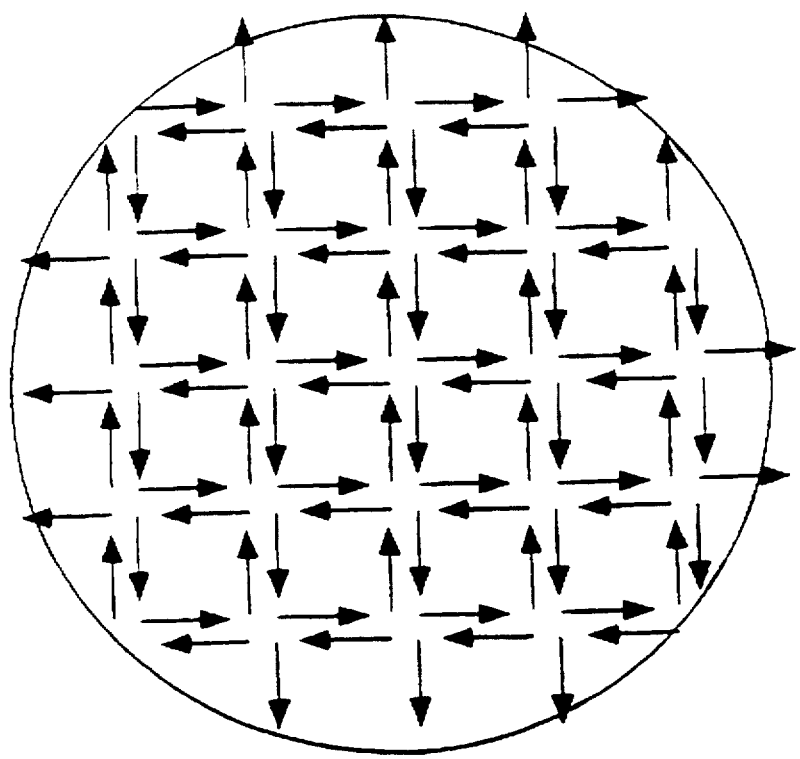

FIG. 16 shows the pattern of FIG. 15 but with increased density.

Figure 17:
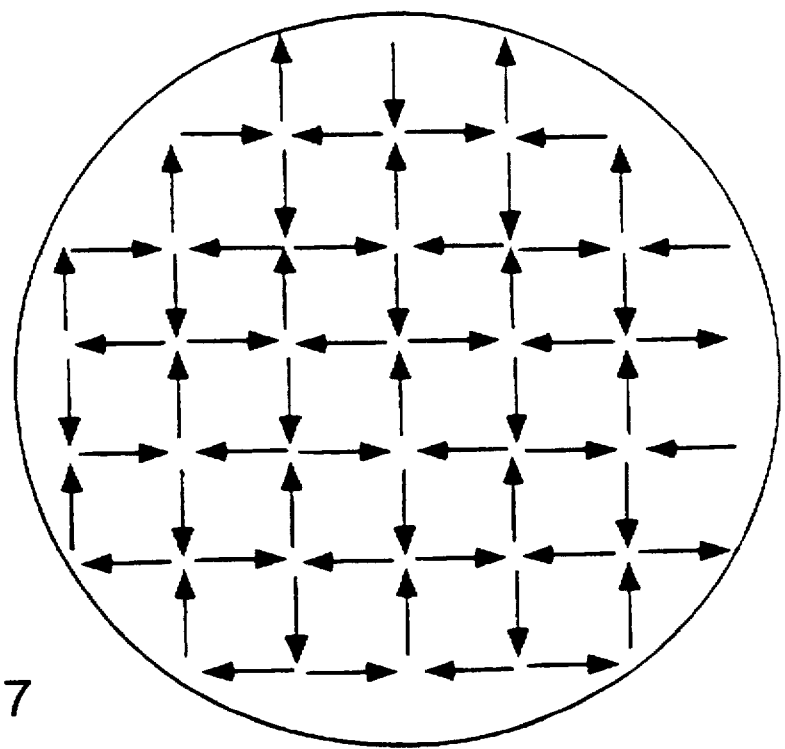

FIG. 17 shows an alternate hole pattern providing only two directly opposing nozzles at each nozzle location.

Figure 18:
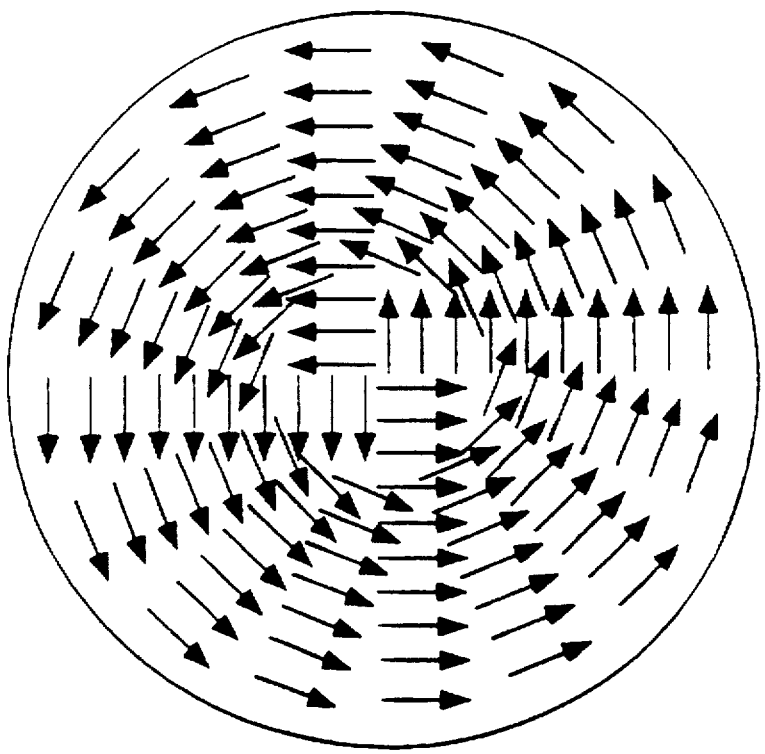

FIG. 18 shows a hole pattern having holes directing gas flow only tangentially from the center of a substrate.

Figure 19:
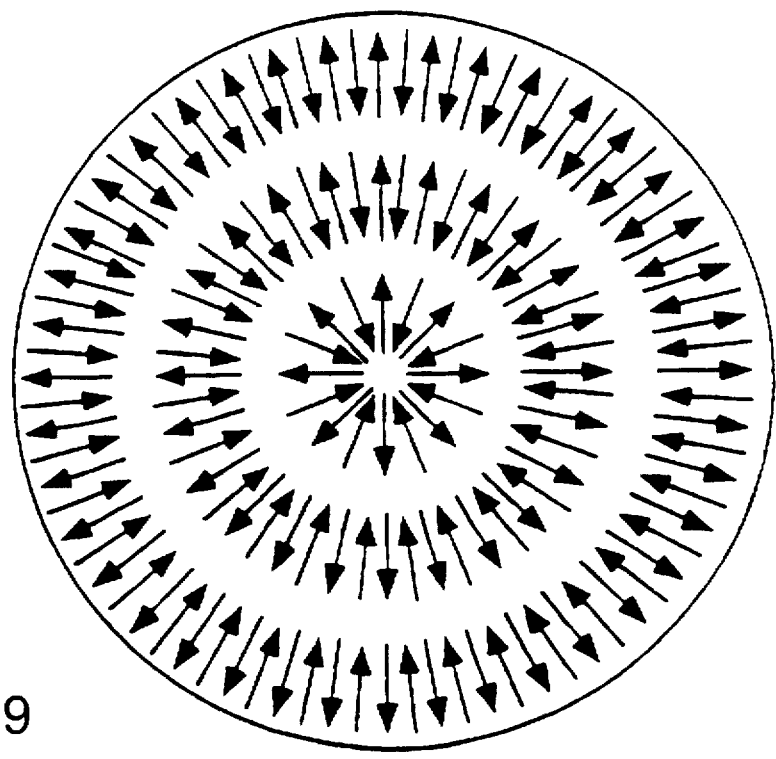

FIG. 19 shows a hole pattern having holes alternately directing gas flow along radial lines from a center of the pattern.

Figure 20:
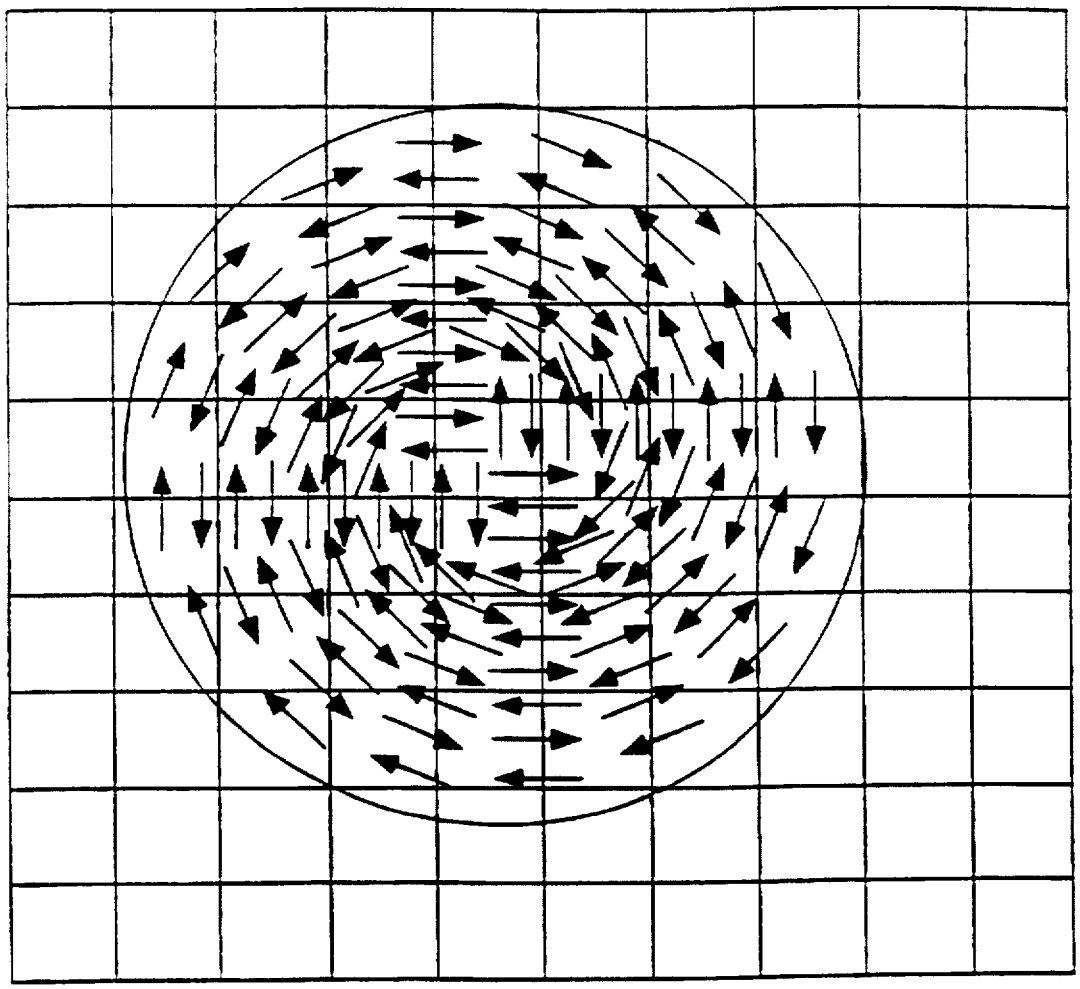

FIG. 20 shows a generally uniform grid superimposed over a hole pattern having tangential lines in progressively larger circles with the direction of flow alternating between adjacent circles.

Figure 21:
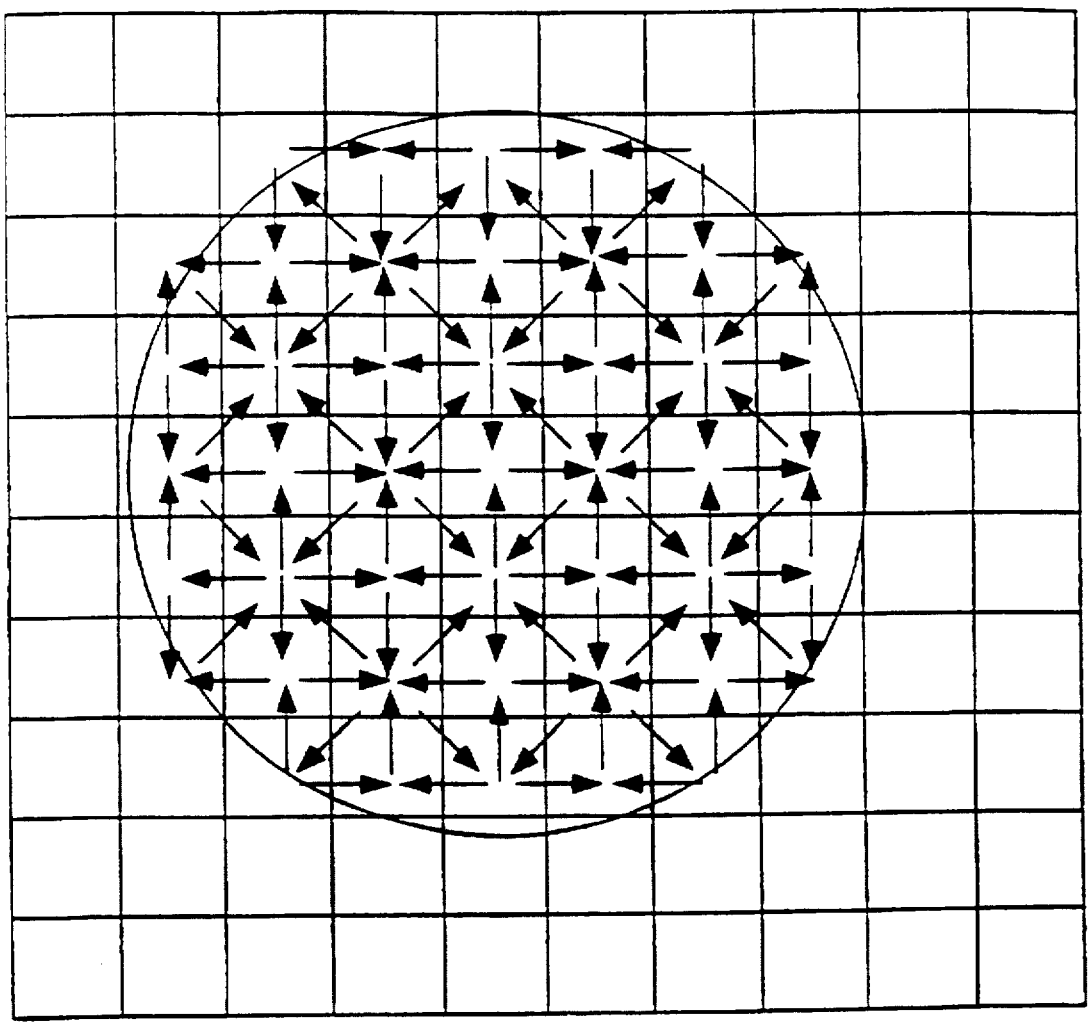

FIG. 21 shows a generally uniform grid superimposed over a hole pattern having orthogonal holes (nozzles) as well as nozzles located at 45 degrees to orthogonal to provide a repeating pattern of generally uniform surface coverage in a pattern of several grids.

Figure 22:
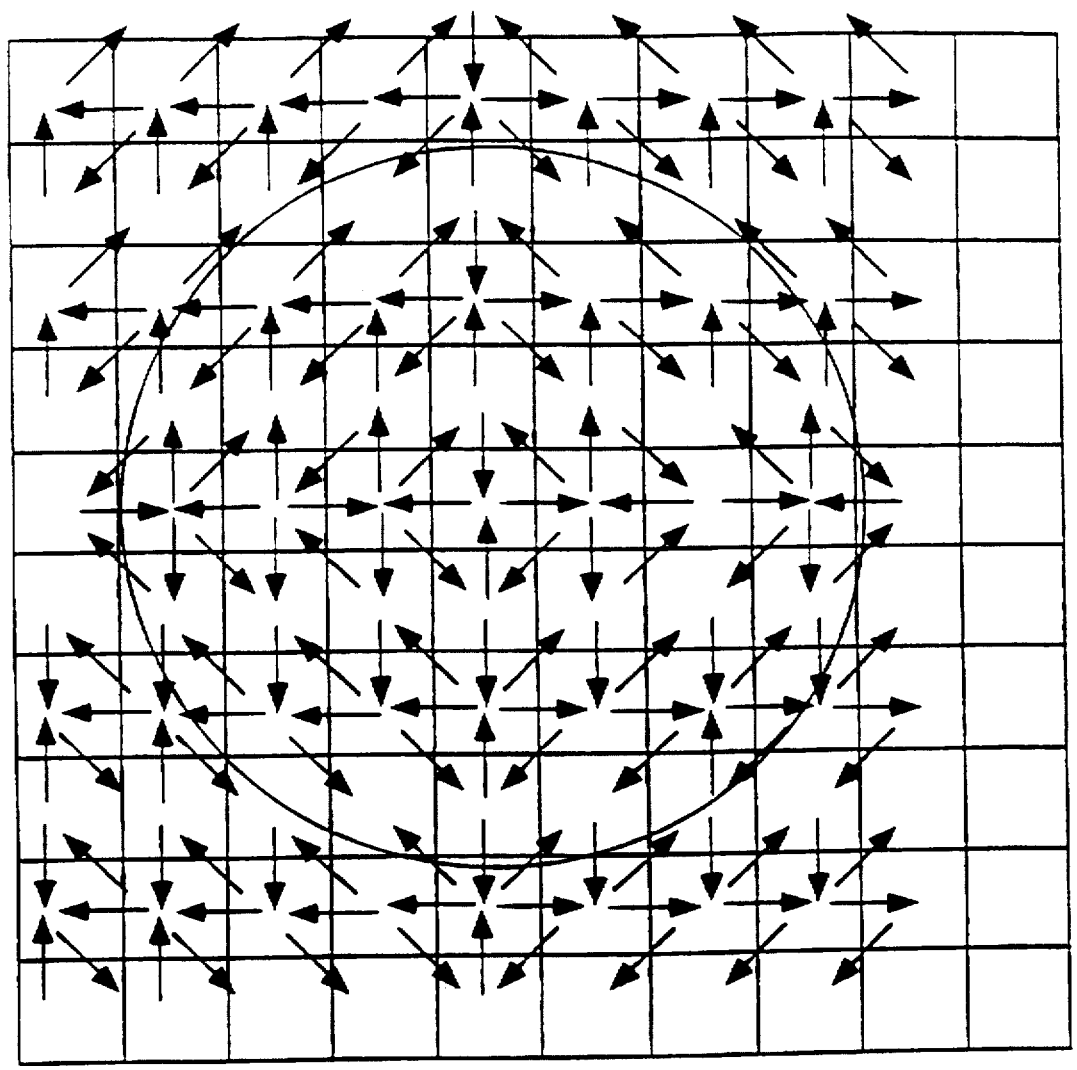

FIG. 22 shows another generally uniform grid superimposed over a hole pattern having orthogonal holes (nozzles)

as well as nozzles located at 45 degrees to orthogonal to provide a repeating pattern of generally uniform surface coverage in each grid of the wafer (for example two arrow heads in each unit of the grid as it covers the circular close-up area of the substrate.

Figure 23:
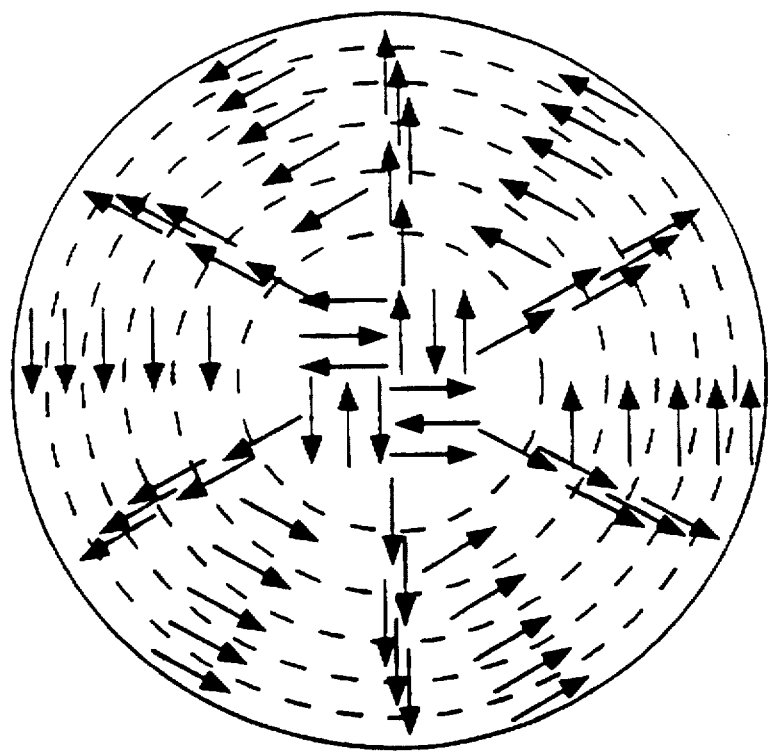

FIG. 23 shows a hole pattern consisting of a series of regions of uniform area separated by dashed lines, showing generally uniform gas flow generated toward the area of each region.

Figure 24:
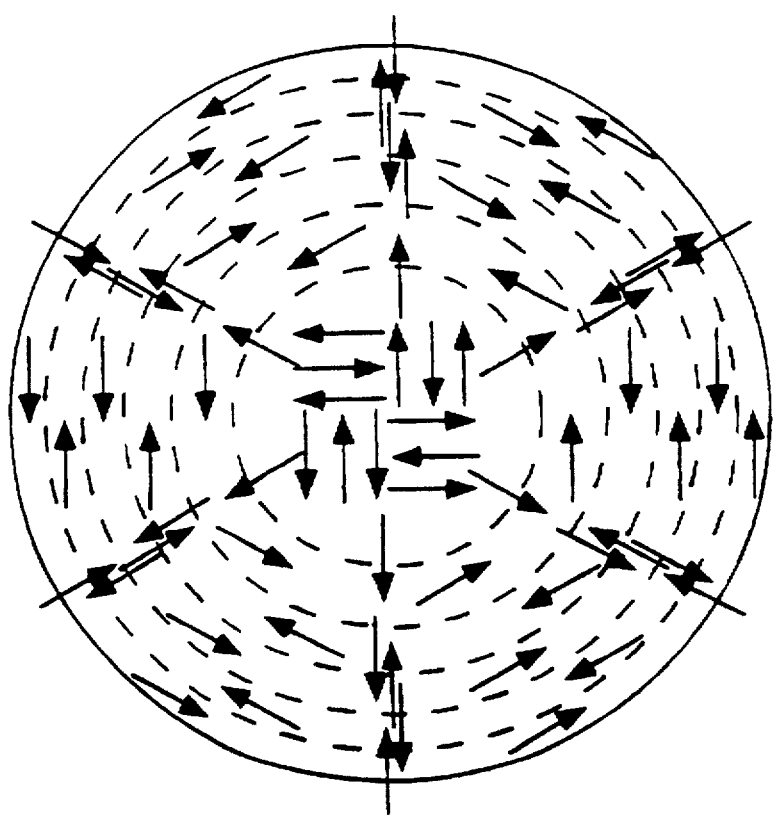

FIG. 24 shows an area pattern as in FIG. 23, but with a different gas hole pattern.

Although we have described the invention in the context of a CVD or PECVD system, the invention might also be used in non-deposition systems where gas flow in a direction not perpendicular to the plane surface of the wafer is likely to have a beneficial effect. For example, it is likely to also be useful in systems for sputtering, sputter etching, ion etching, ion milling, and ion treatment (e.g. bombardment) of a surface.

While the invention has been described with regards to specific embodiments, those skilled in the art will recognize that changes can be made in form and detail without departing from the spirit and scope of the invention. The evaluations described above were meant to be merely representative of the invention and should not be considered to limit the scope of the invention. Other embodiments are within the following claims.

What is claimed is:

1. A substrate processing system comprising:

a chamber;

a pedestal within the chamber which holds a substrate in a processing position during processing; and a gas distribution structure which during processing is located in the chamber directly opposite the substrate when the substrate is held at said processing position and distributes a process gas onto a surface of the substrate that is held on the pedestal for processing, said gas distribution structure comprising a gas distribution faceplate having a plurality of gas distribution holes formed therethrough and emerging at a front surface of the faceplate, wherein the holes of at least a first set of said plurality of holes are circular and pass through the faceplate at angles other than perpendicular to the front surface of said faceplate.

2. The substrate processing system of claim 1 wherein the holes of the first set of said plurality of holes are oriented to direct gas flowing out from the front surface of the faceplate at angles between 85° and 5° relative to the front surface of said faceplate.

3. The substrate processing system of claim 2 wherein the holes of the first set of said plurality of holes are oriented to direct gas flowing out from the front surface of the faceplate at angles between 85° and 45° relative to the front surface of said faceplate.

4. The substrate processing system of claim 3 wherein the holes of the first set of said plurality of holes are oriented to direct gas flowing out from front suarface of the faceplate at angles between 82° and 62° relative to the front surface of said faceplate.

5. The substrate processing system of claim 4 wherein the holes of the first set of said plurality of holes are oriented to direct gas flowing out from front surface of the faceplate at angles between 77° and 67° relative to the front surface of said faceplate.

6. The substrate processing system of claim 5 wherein the holes of the first set of said plurality of holes are oriented to direct gas flowing out from front surface of the faceplate at an angle of about 72° relative to the front surface of said faceplate.

7. The substrate processing system of claim 3 wherein a subset of said first set of said holes are parallel to one another.

8. The substrate processing system of claim 3, wherein a subset of said first set of said holes are disposed to direct the gas exiting from said subset of said first set of holes in directions which have a component that is parallel to the surface of the substrate being processed, such that the components of such holes direct gas exiting from such holes in directions which are parallel to one of two orthogonal axes and said holes in said faceplate are configured such that the pattern of holes directs gas toward a substrate such that a hypothetical hole image pattern on the surface of the substrate resulting from a hypothetical linear path of gas flow from the holes to the surface of the substrate generally uniformly covers the area of the surface of the substrate.

9. The substrate processing system of claim 1 wherein during processing the bottom surface of the faceplate is parallel to the surface of the substrate.

10. The substrate processing system of claim 9 wherein the holes of a second set of the plurality of holes pass through the faceplate at angles other than perpendicular to the bottom surface of the faceplate and different from the angles of the first set of holes.

11. The substrate processing system of claim 1 wherein the holes of the first set are parallel to each other.

12. The substrate processing system of claim 1 wherein the plurality of holes are uniformly distributed over a region of the faceplate.

13. The substrate processing system of claim 1 wherein the chamber is a vacuum chamber.

14. The substrate processing system of claim 1 wherein all of the holes of said plurality of holes are circular.

* * * * *